United States Patent [19]

Nicholls et al.

[11] Patent Number: 5,541,434

[45] Date of Patent: Jul. 30, 1996

[54] SEMICONDUCTOR DEVICE INCORPORATING A CONTACT FOR ELECTRICALLY CONNECTING ADJACENT PORTIONS WITHIN THE SEMICONDUCTOR DEVICE

[75] Inventors: Howard C. Nicholls, Wales; Michael J. Norrington, Essex, both of United Kingdom

[73] Assignee: Inmos Limited, United Kingdom

[21] Appl. No.: 119,519

[22] Filed: Sep. 10, 1993

[30] Foreign Application Priority Data

Sep. 11, 1992 [GB] United Kingdom .................. 9219268

[51] Int. Cl.⁶ ..................................................... H01L 29/76
[52] U.S. Cl. ........................... 257/383; 257/641; 257/900
[58] Field of Search ........................................ 257/382, 383, 257/900, 393, 640, 641, 649, 903, 344, 408

[56] References Cited

U.S. PATENT DOCUMENTS

| | | |
|---|---|---|
| 4,042,953 | 8/1977 | Hall . |
| 4,859,630 | 8/1989 | Josquin .................................. 257/383 |
| 4,912,540 | 3/1990 | Sander et al. . |
| 5,099,308 | 3/1992 | Murayama ................................ 357/71 |
| 5,148,247 | 9/1992 | Miura et al. ............................. 257/330 |
| 5,210,429 | 5/1993 | Adan ...................................... 257/393 |
| 5,234,850 | 8/1993 | Liao ....................................... 257/344 |
| 5,245,210 | 9/1993 | Nishigoori ............................... 257/383 |

FOREIGN PATENT DOCUMENTS

| | | |
|---|---|---|
| 0094559A1 | 12/1983 | European Pat. Off. . |
| 0127020A2 | 12/1984 | European Pat. Off. . |
| 0272050 | 6/1988 | European Pat. Off. . |
| 0272051A2 | 6/1988 | European Pat. Off. . |
| 0308964A2 | 8/1990 | European Pat. Off. . |
| 63-62380 | 3/1988 | Japan .................................... 257/640 |
| 63-278256 | 11/1988 | Japan . |
| 2-28939 | 1/1990 | Japan .................................... 257/900 |
| 2-156542 | 6/1990 | Japan .................................... 257/383 |
| 3-278576 | 12/1991 | Japan .................................... 257/640 |

*Primary Examiner*—Sara W. Crane
*Assistant Examiner*—Courtney A. Bowers
*Attorney, Agent, or Firm*—Felsman, Bradley, Gunter & Dillon, LLP

[57] ABSTRACT

A semiconductor device comprising a silicon substrate, an oxide layer on the silicon substrate, a doped polysilicon region disposed on the oxide layer, a dielectric layer which has been deposited over the doped polysilicon region and the silicon substrate, a contact hole which is formed in the dielectric layer and extends over respective laterally adjacent portions of the doped polysilicon region and the silicon substrate and a contact which has been selectively deposited in the contact hole which electrically connects the said portions together. The invention also provides a method of fabricating a semiconductor device incorporating a refractory metal contact, the method comprising the steps of: a) providing a semiconductor substrate having an oxide layer thereon and a doped polysilicon region disposed on the oxide layer; (b) depositing a dielectric layer over the doped polysilicon region and over the silicon substrate; (c) forming a contact hole in the dielectric layer which exposes a portion of the doped polysilicon region and a laterally adjacent portion of the silicon substrate; and (d) selectively depositing a contact into the contact hole thereby electrically to connect together the doped polysilicon region and the silicon substrate.

10 Claims, 7 Drawing Sheets

5,541,434

SEMICONDUCTOR DEVICE INCORPORATING A CONTACT FOR ELECTRICALLY CONNECTING ADJACENT PORTIONS WITHIN THE SEMICONDUCTOR DEVICE

BACKGROUND TO THE INVENTION

The present invention relates to a semiconductor device incorporating a contact and to a method of fabricating such a semiconductor device.

In CMOS semiconductor devices and processes it is known to employ electrical contacts between polysilicon, such as a polysilicon signal line, which signal line may integrally connect with a polysilicon gate layer, and diffusion silicon, such as a doped region of the silicon substrate of the device, which doped region is an active area of the device. Such polysilicon/diffusion silicon contacts have in the past been produced by forming two contact holes in the dielectric layer which overlies the polysilicon and the diffusion silicon, one contact hole extending down to the upper surface of the polysilicon and another contact hole spaced from the first contact hole extending down to the diffusion silicon. A metal wire is then located in the two contact holes and extends therebetween over the region of the dielectric layer which is located between the two contact holes. The known arrangement has layout disadvantages because each contact is subject to spacing constraints which are imposed by the requirement electrically to isolate any two contacts.

It is also known to employ a local interconnect layer, for example of titanium nitride or titanium silicide, as a strap which connects the polysilicon to the diffusion silicon with the strap extending over the upper surface of the polysilicon and of the diffusion silicon. The local interconnect layer is formed after the patterning of the polysilicon but before the deposition of the dielectric layer whereby the strap is covered by the dielectric layer. This arrangement suffers from the disadvantage that the manufacturing process is relatively complex since additional deposition and etch steps for the local interconnect layer are required.

In addition, it is also known to employ local removal of gate oxide between polysilicon and active silicon to produce a direct electrically conducting contact which is a buried contact. However, this method is limited to connecting N+ polysilicon to N+ active silicon because, if opposite types are attempted to be connected, subsequent heat treatment steps at greater than 800° C. can cause parasitic diodes to be formed in the diffusion silicon.

It is well known to employ an aluminium metal contact which is deposited by sputtering in a contact hole in a dielectric layer and extends down either to the polysilicon i.e. to a signal line or to the diffusion silicon substrate i.e. to an active area. It has been proposed to provide a contact between the polysilicon and the diffusion silicon by forming a contact of aluminium metal in the form of a strap which extends over both the polysilicon and the diffusion silicon. However, such aluminium contacts suffer from the disadvantage that the lateral dimensions of the contact hole and the contact are relatively large in order to enable the aluminium reliably to form the contact with effective electrical connections.

SUMMARY OF THE INVENTION

The present invention provides a semiconductor device comprising a silicon substrate, an oxide layer on the silicon substrate, a doped polysilicon region disposed on the oxide layer, a dielectric layer which has been deposited over the doped polysilicon region and the silicon substrate, a contact hole which is formed in the dielectric layer and extends over respective laterally adjacent portions of the doped polysilicon region and the silicon substrate and a contact which has been selectively deposited in the contact hole which electrically connects the said portions together.

The present invention also provides a method of fabricating a semiconductor device incorporating a refractory metal contact, the method comprising the steps of: (a) providing a semiconductor substrate having an oxide layer thereon and a doped polysilicon region disposed on the oxide layer; (b) depositing a dielectric layer over the doped polysilicon region and over the silicon substrate; (c) forming a contact hole in the dielectric layer which exposes a portion of the doped polysilicon region and a laterally adjacent portion of the silicon substrate; and (d) selectively depositing a contact into the contact hole thereby electrically to connect together the doped polysilicon region and the silicon substrate.

BRIEF DESCRIPTION OF THE DRAWINGS

Embodiments of the present invention will now be described by way of example only with reference to the accompanying drawings, in which.

DETAILED DESCRIPTION OF THE PREFERRED EMBODIMENTS

Figure 1A:
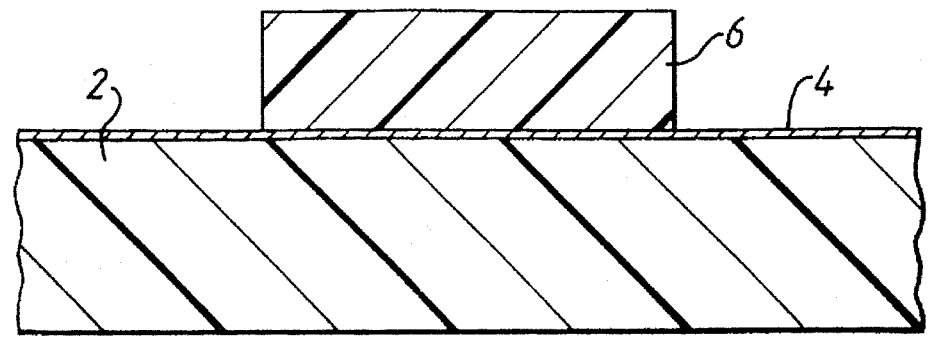
FIGS. 1a to 1e are schematic sections through a silicon wafer structure showing sequentially a series of process steps for manufacturing a semiconductor device in accordance with a first embodiment of the present invention.
Figure 1B:
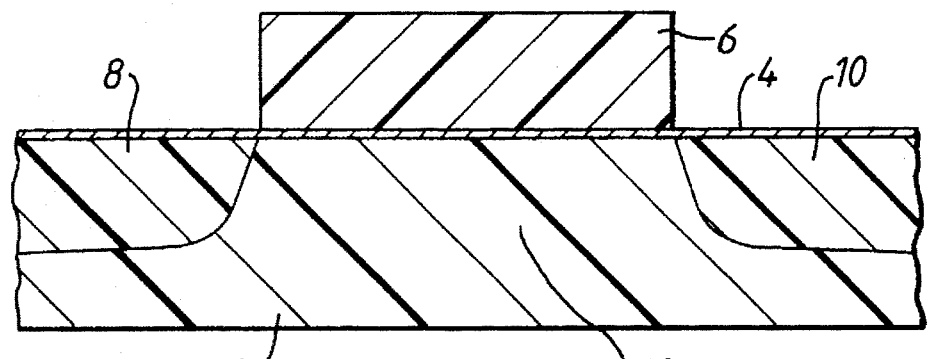
Figure 1C:
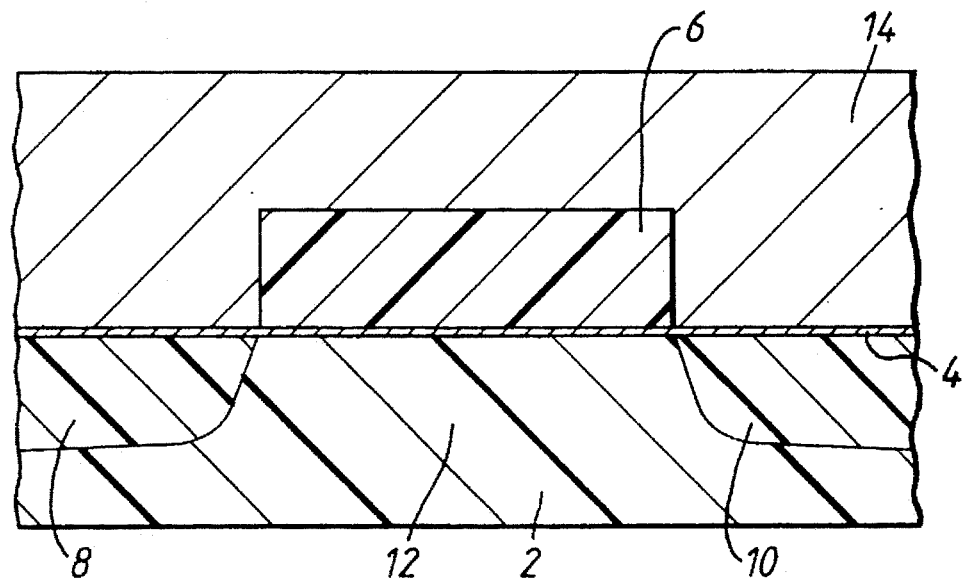
Figure 1D:
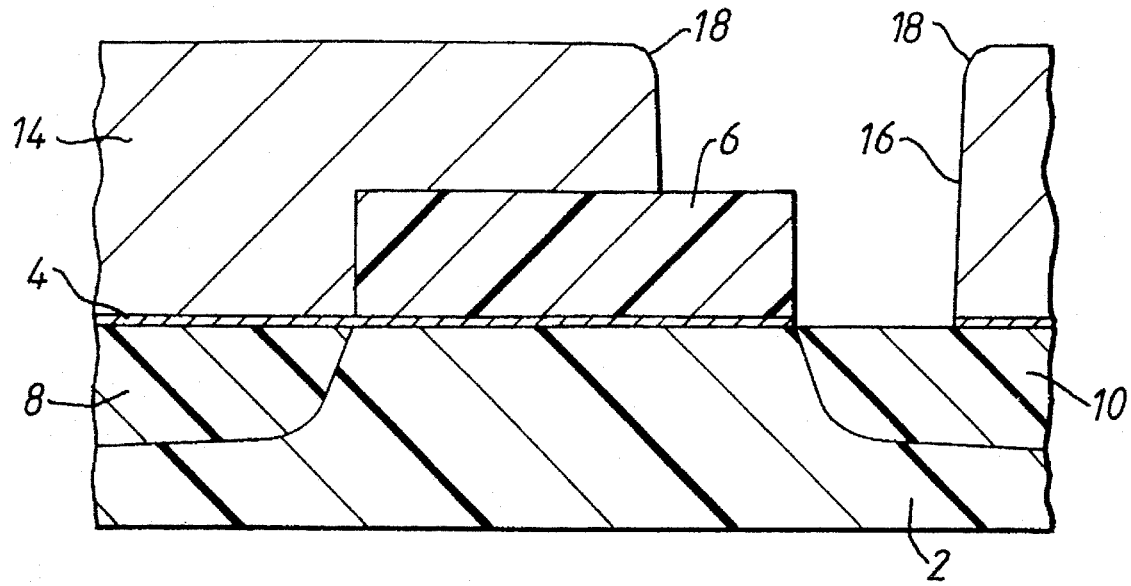
Figure 1E:
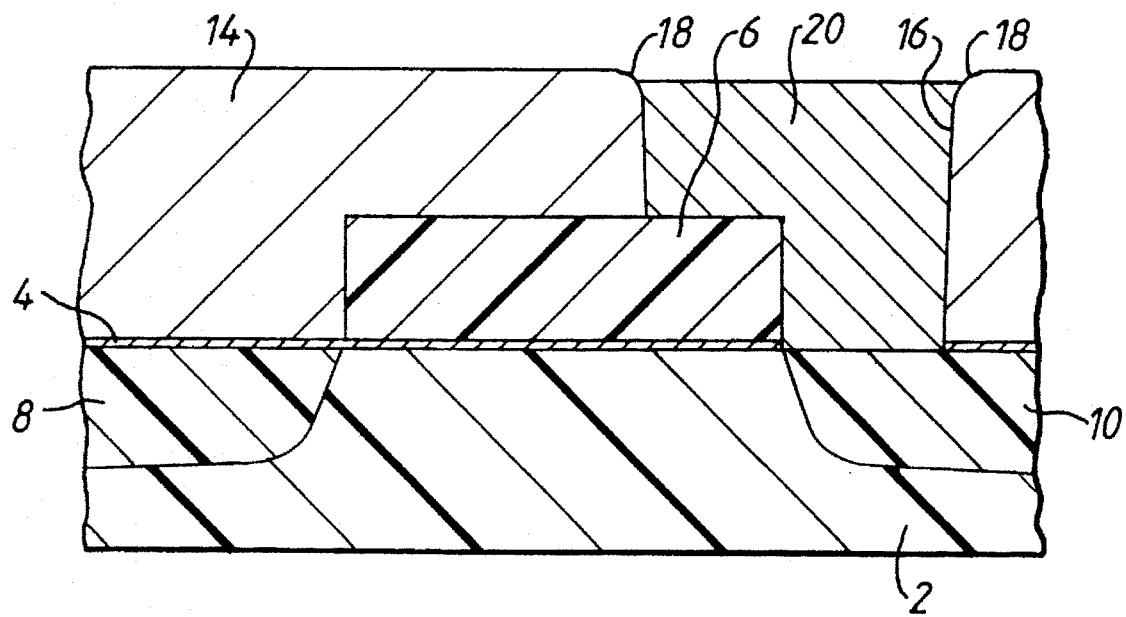

Referring to FIGS. 1a to 1e there is shown a process flow for the manufacture of a semiconductor device in accordance with the first embodiment of the present invention. A substrate 2 of diffusion silicon is provided with a gate oxide layer 4 which has been grown thereover so as preferably to have a thickness of from 50 to 500 Angstroms, more preferably approximately 200 Angstroms. A region 6 of doped polysilicon, the dopant being either of N+ or P+ polarity depending on the semiconductor device being formed, is subsequently grown and then patterned on the gate oxide layer 4. The region 6 of doped polysilicon acts, in the resultant semiconductor device, as a signal line and is integrally connected with a transistor gate layer of polysilicon which is located on the gate oxide layer over source and drain regions of the transistor. The polysilicon region 6 preferably has a thickness of from 1000 to 6000 Angstroms, more preferably around 3000 Angstroms. The initial structure is shown in FIG. 1a. As shown in FIG. 1b, a dopant is then implanted into the silicon substrate so as to form active silicon implant regions 8,10 of the required polarity on opposed sides of the polysilicon region 6. The regions 8,10 may be the same or opposite polarity as that of the doped polysilicon region 6. The polysilicon region 6 masks from dopant implantation that region 12 of the silicon substrate 2 which is located thereunder. A dielectric layer 14, preferably of reflowable oxide, is then deposited over the polysilicon region 6 and the gate oxide 4 extending over the implant regions 8,10 and then the dielectric layer 14 is densified in a known manner. Preferably, the dielectric layer 14 has a deposited thickness of from 4000 to 12000 Angstroms, more preferably 7500 Angstroms (the thickness changing after subsequent reflow of the dielectric layer). The resultant structure is shown in FIG. 1c. Referring now to FIG. 1d a contact hole 16 is then etched in known manner in the oxide dielectric layer 14 and the gate oxide layer 4, with the contact hole being positioned so as to extend over both a portion of the polysilicon region 6 and a portion of the implanted region 10 of the silicon substrate 2, which portions are laterally adjacent. Preferably, the contact hole etch is a dry etch which occurs in a fluorine- and carbon-containing plasma at pressures up to 4 Torr, and typically in the range of from 0.05 to 3 Torr. In this embodiment and in each of the other embodiments, the etching of the contact hole is controlled whereby there is a single etch step and polysilicon is not etched. However, a multiple etch step process may alternatively be employed. Thus the etching occurs down to the polysilicon gate and down to the silicon substrate without removal of silicon by the etch. The silicon structure is then subject to a reflow step at which the structure is heated, for example by a rapid thermal anneal, so as to reflow the dielectric layer 14 and form smoothed edges 18 of the contact hole 16 thereby to facilitate subsequent deposition of a refractory metal therein. As is shown in FIG. 1e, a refractory metal, e.g. tungsten is then selectively deposited into the contact hole 16 so as to form a tungsten butting .contact 20 therein which electrically connects the polysilicon region 6 to the implanted region 10 of the silicon substrate 2. The upper surface of the tungsten butting contact 20 may be covered by a dummy metal pad (not shown), for example of aluminium, the dummy metal pad being formed simultaneously when conventional interconnect layers are formed over the dielectric layer. Alternatively, the contact 20 may be connected to the metal layer providing a metal to polysilicon to silicon substrate contact.

Figure 2A:
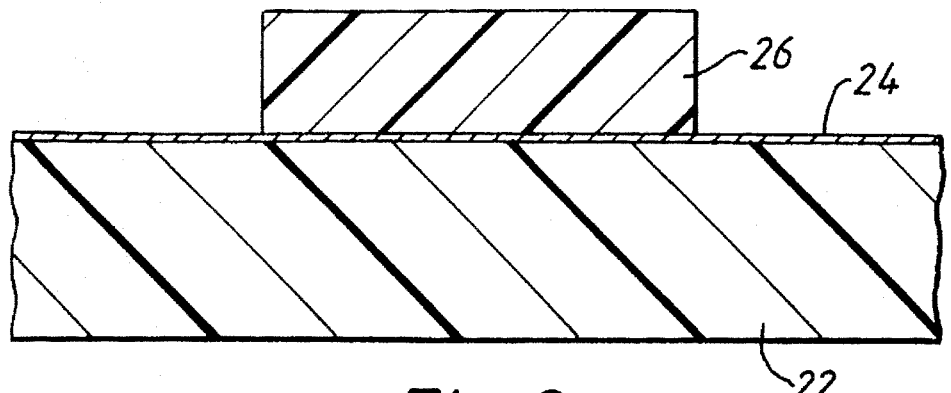
FIGS. 2a to 2f are schematic sections through a silicon wafer structure showing sequentially a series of process steps for manufacturing a semiconductor device in accordance with a second embodiment of the present invention.
Figure 2B:
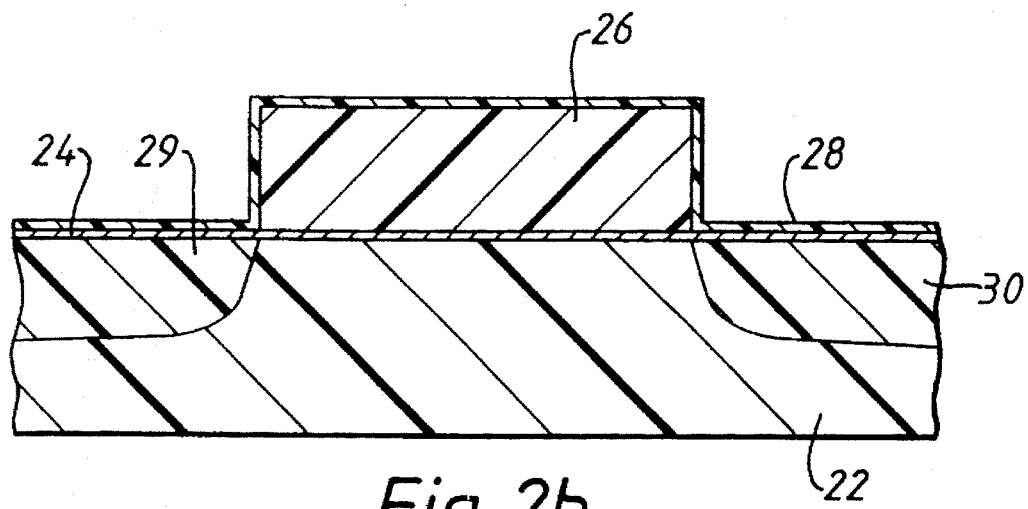
Figure 2C:
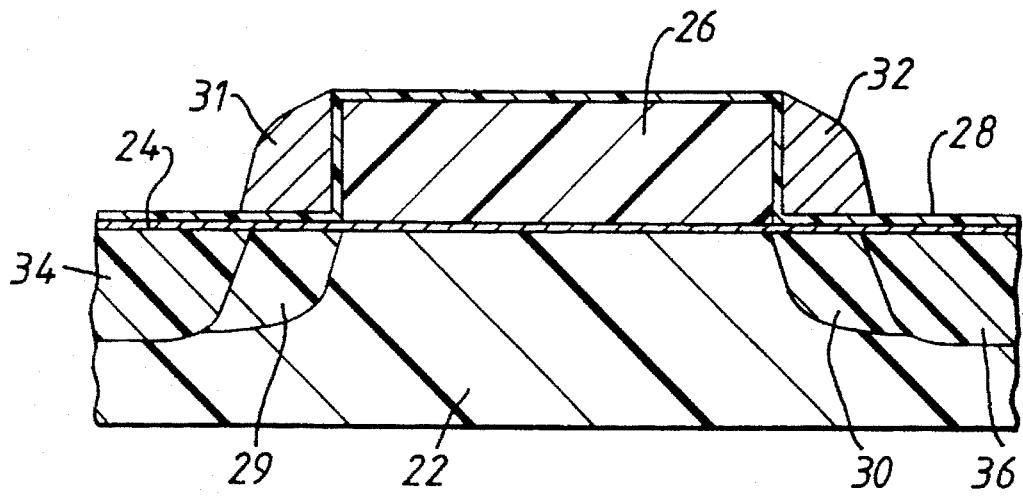

A second embodiment of the present invention is illustrated in FIGS. 2a to 2f, the second embodiment being a modification of the first embodiment. In the second embodiment, the initial structure is the same as that of the first embodiment in which a gate oxide layer 24 is grown over a silicon substrate 22 and then a doped polysilicon region 26 is grown and patterned over the gate oxide layer 24. As is shown in FIG. 2b, a silicon nitride layer 28 preferably from 200 to 1000 Angstroms thick, more preferably approximately 400 Angstroms thick, is deposited over the polysilicon region 26 and the exposed parts of the gate oxide layer 24. An implanting step is then carried out in which lightly doped implant regions 29,30 are formed in the silicon substrate 22 on opposed sides of the polysilicon region 26. The lightly doped regions 29,30 are laterally spaced from the polysilicon region 26 by a distance equal to the thickness of the silicon nitride layer 28 which acts to reduce tunneling or hot electron effects. The resultant structure is shown in FIG. 2b. Referring now to FIG. 2c, a dielectric layer, for example an oxide layer, is then formed over the silicon nitride layer 28 and then the dielectric layer is anisotropically etched back to form side wall spacers 31,32 of dielectric on opposed sides of the polysilicon region 26. The side wall spacers 31,32 preferably have a width at their lower extremities of around 2000 Angstroms. After the side wall spacers 31,32 have been formed, a dopant is implanted into the silicon substrate 22 and into a respective lightly doped region 29,30 to form implanted regions 34,36 on opposed sides of the polysilicon region 26. Each implanted region 34,36 has the same polarity as that of the respective adjacent lightly doped region 29,30 and is superimposed over that part of the respective lightly doped region 29,30 which is not masked by the respective sidewall spacer 31,32. Thus, the implanted regions 34,36 each have an edge which is defined by the edge of the respective side wall spacer 31,32, the side wall spacers 31,32 having acted to mask the lightly doped silicon regions 29,30 thereunder from dopant implantation.

Figure 2D:
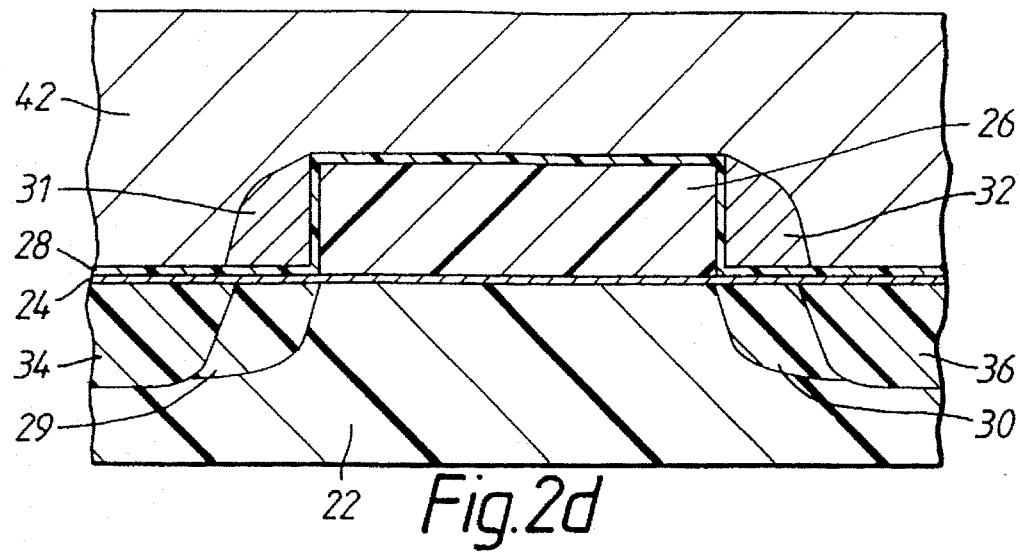
Figure 2E:
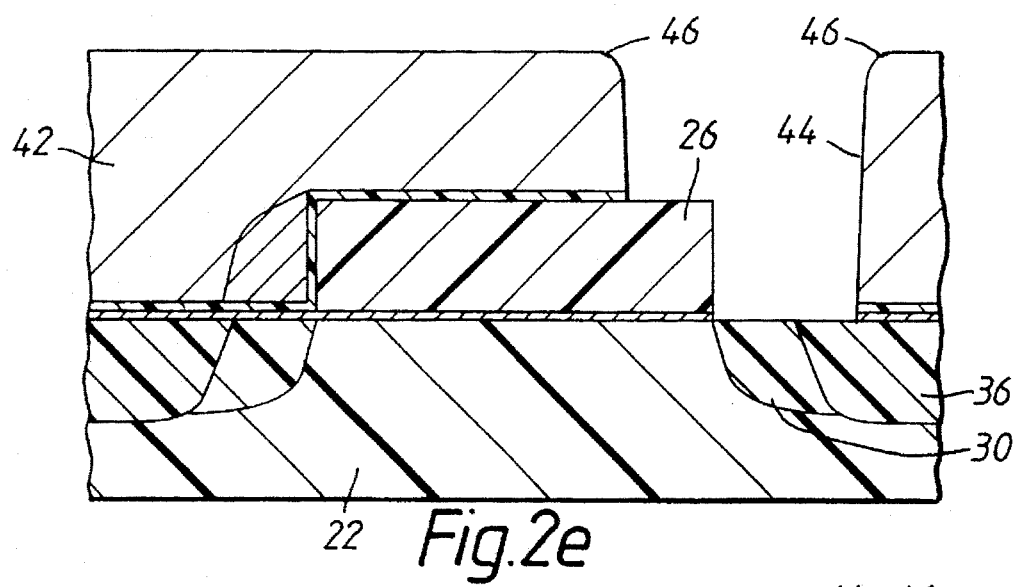
Figure 2F:
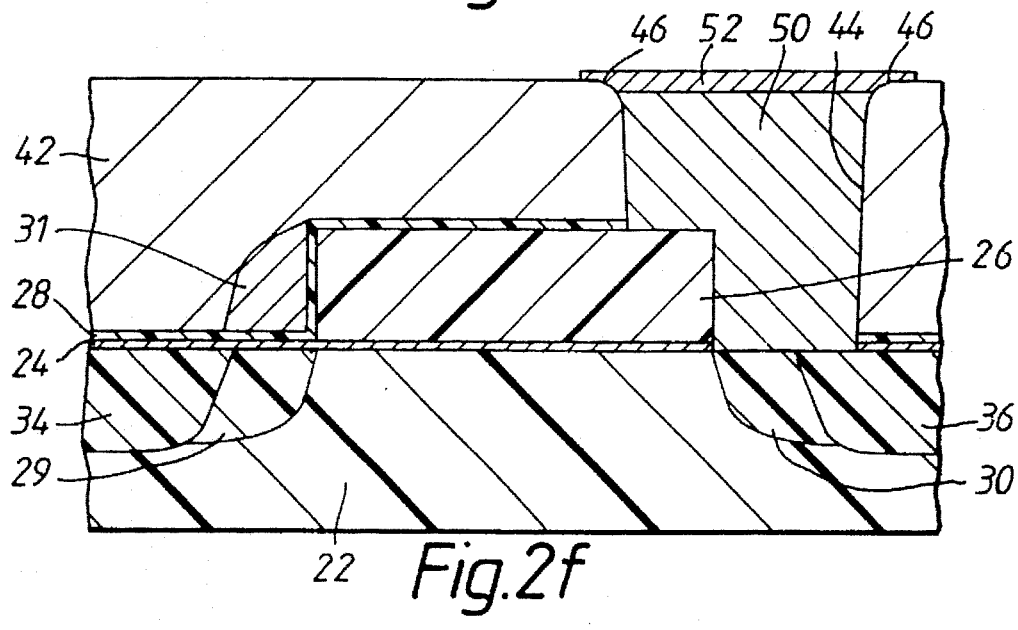

A dielectric layer 42 is then deposited over the structure of FIG. 2c to form the structure shown in FIG. 2d and then the dielectric layer 42 is densified in a known manner. Subsequently, as shown in FIG. 2e a contact hole 44 is etched in the dielectric layer 42 and the dielectric layer 42 is reflowed as in the first embodiment to form reflowed edges 46 of the contact hole 44. The contact hole 44 is etched e.g. (in the manner described above with reference to the first embodiment) through the dielectric layer 42 and through the silicon nitride layer 28 which extends over the polysilicon region 26 and also through the gate oxide layer 24 which is disposed over the implanted region 36 and the lightly doped region 30. The side wall spacer 32 may be removed during the formation of the contact hole 44. In the case where the oxide side wall spacer is only partially removed, the etch process acts to condition the surface of the oxide side wall spacer through surface polymer deposition and/or surface damage such that subsequent tungsten deposition occurs in a continuous film from the polysilicon, side wall spacer and active silicon surfaces. The resultant structure is shown in FIG. 2e from which it will be seen that laterally adjacent portions of the polysilicon region 26 and of the implanted regions of the silicon substrate are exposed by the contact hole 44. The contact hole 44 is then filled with a selectively deposited tungsten contact 50 which covers the exposed part of the polysilicon region 26 and the implanted region 36 and the lightly doped region 29. As in the first embodiment, the top of the tungsten butted contact may be covered with a dummy metal layer 52 which is illustrated in FIG. 2f or connected to the metal layer.

In an alternative arrangement instead of the lightly doped regions being formed before the implanted regions, the implanted regions 34,36 may be formed after the anistropic etching step to form the sidewall spacers whereby the sidewall spacers mask the regions to be lightly doped. The photoresist employed during the implanting step is left in place and then a wet etch is carried out to remove the sidwall spacers 31,32. A lightly doped implant is then performed in order to form the lightly doped regions 29,30.

In the second embodiment, the silicon nitride layer 28 is employed laterally to space the lightly doped regions 29,30 relative to the polysilicon region 26 and also to act as an etch stop during the anistropic etch to form the spacers. Furthermore, the remaining silicon nitride layer 28 can act as a sealing layer adjacent the tungsten butting contact so as to inhibit the formation of tungsten silicide along the gate oxide/silicon interface in the manner disclosed in our EP-A-0391562 entitled "Semiconductor devices incorporating a tungsten contact and fabrication thereof".

Figure 3A:
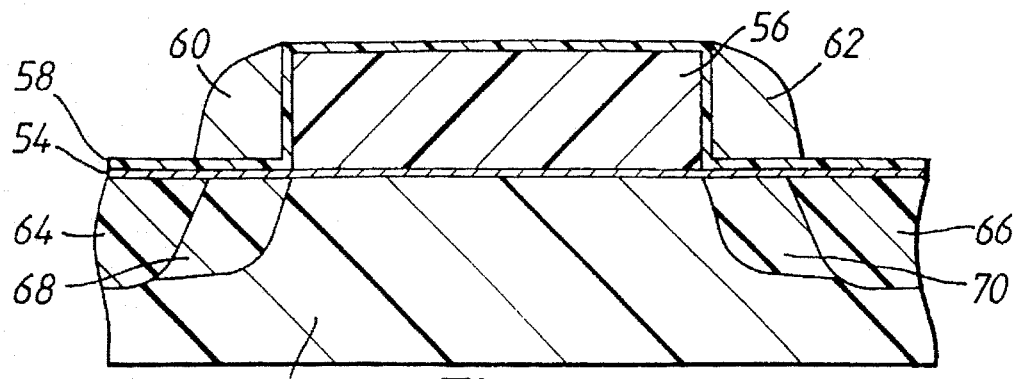
FIGS. 3a to 3d are schematic sections through a silicon wafer structure showing sequentially a series of process steps for manufacturing a semiconductor device in accordance with a third embodiment of the present invention.
Figure 3B:
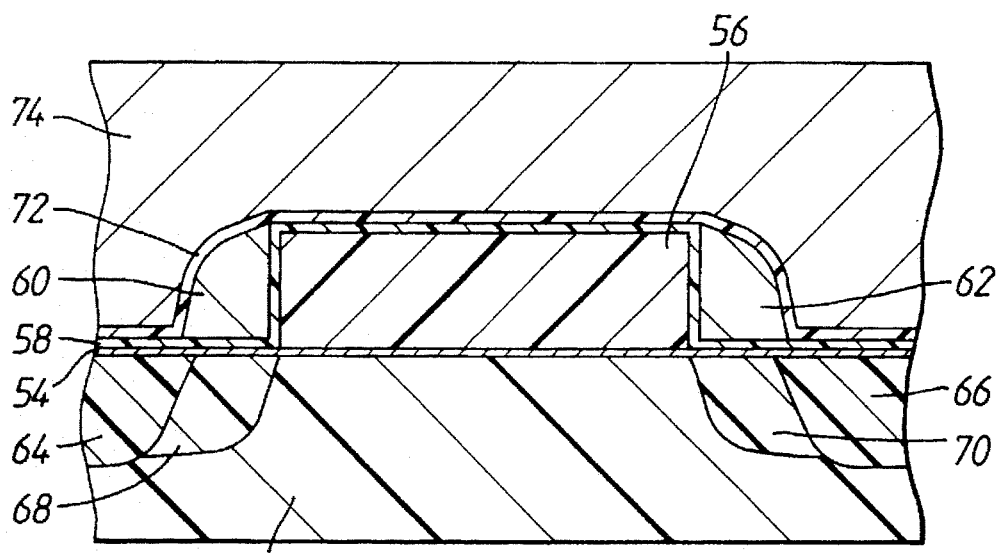
Figure 3C:
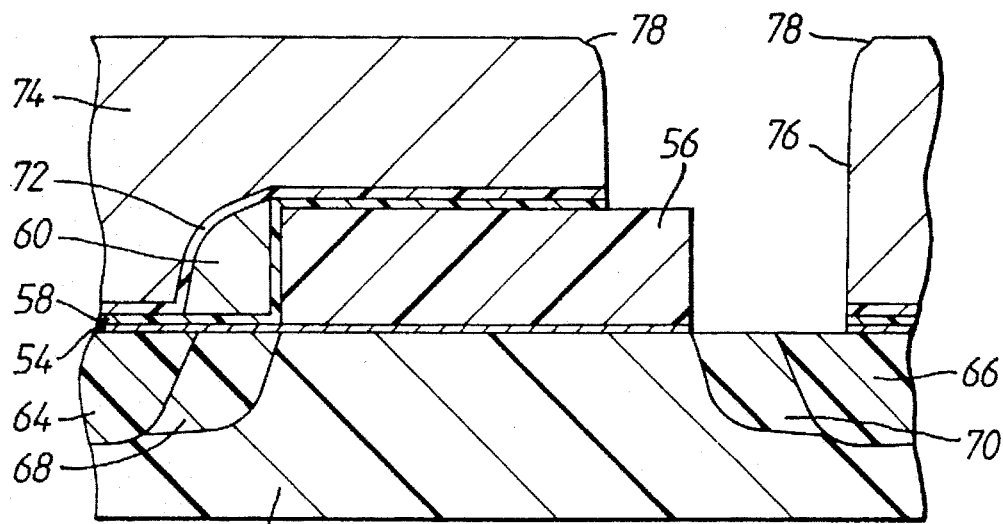
Figure 3D:
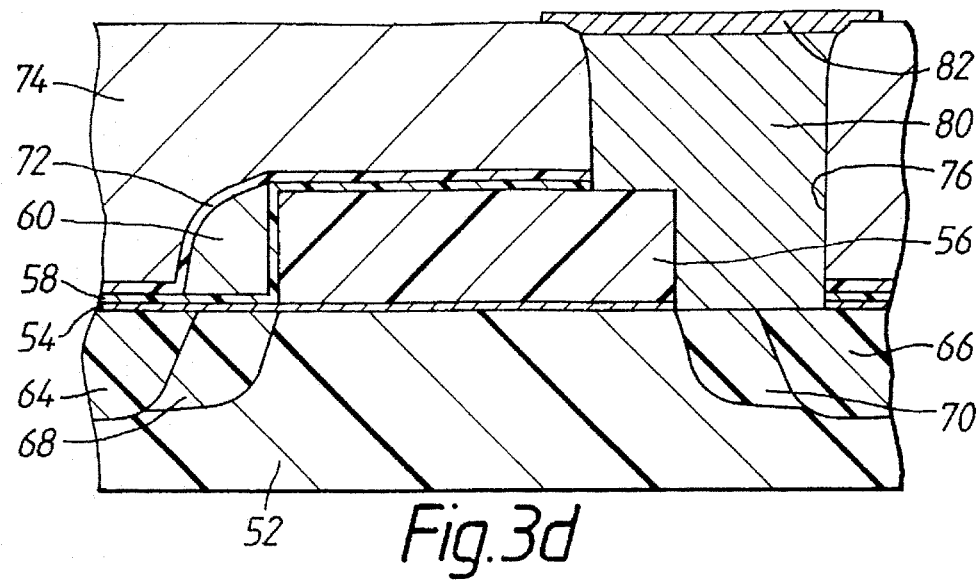

A third embodiment of the present invention is illustrated in FIGS. 3a to 3d. This embodiment is a modification of the second embodiment. In the third embodiment, the sequence of process steps up to the formation of side wall spacers and the formation of the lightly doped regions and the implanted regions adjacent the spacers is the same as that of the second embodiment. FIG. 3a shows the structure in which a gate oxide layer 54 is disposed on a silicon substrate 52 and a polysilicon region 56 is disposed on the gate oxide layer 54. A silicon nitride layer 58 extends over the polysilicon layer 56 and the gate oxide layer 54 and side wall spacers 60,62 have been formed on opposed sides of the polysilicon region 56. Implanted regions 64,66 and lightly doped regions 68,70 are located in the silicon substrate 52 on respective opposed sides of the polysilicon region 56. Referring to FIG. 3b a second silicon nitride layer 72 is deposited over the polysilicon layer 56, the side wall spacers 60,62 and the silicon nitride layer 58, and then a dielectric layer 74 is deposited over the silicon nitride layer 72 and subsequently densified. As is shown in FIG. 3c, a contact hole 76 is etched through the dielectric layer 74, the silicon nitride layers 72,58, the side wall spacer 62 and the gate oxide layer 54 so as to expose a portion of the polysilicon region 56 and, laterally adjacent thereto, the implanted region 66 and the lightly doped region 70. The etching may be performed in the manner described above with reference to the first embodiment. The dielectric material 74 is then reflowed to form reflowed edges 78 to facilitate selective tungsten deposition in the contact hole 76. As is shown in FIG. 3d, tungsten is then selectively deposited into the contact hole 76 to form a tungsten butting contact 80 which is subsequently covered with a dummy metal layer 82 or connected to the metal layer.

In the third embodiment, the second silicon nitride layer 72 acts to thicken the first nitride layer 58 above the implanted regions 64,66 so as to cover any holes extending through the nitride which can be formed in the first nitride layer during the etching step to form the sidewall spacers. The second silicon nitride layer ensures that a sufficient thickness of silicon nitride remains after any etching in order to seal the interface with the gate oxide. The thickness of the first silicon nitride layer is, in both the second and third embodiments, selected so as to determine the required lateral spacing of the lightly doped region from the gate. However, when the spacing is small, the first silicon nitride layer may not be thick enough to prevent holes being formed therein during etching which extends down to the dielectric beneath. The use of a second silicon nitride layer as in the third embodiment overcomes this problem. In the third embodiment, the second silicon nitride layer also acts as a sealing layer adjacent the tungsten butting contact in the manner referred to hereinabove with reference to our earlier EP-A-0391562.

Figure 4A:
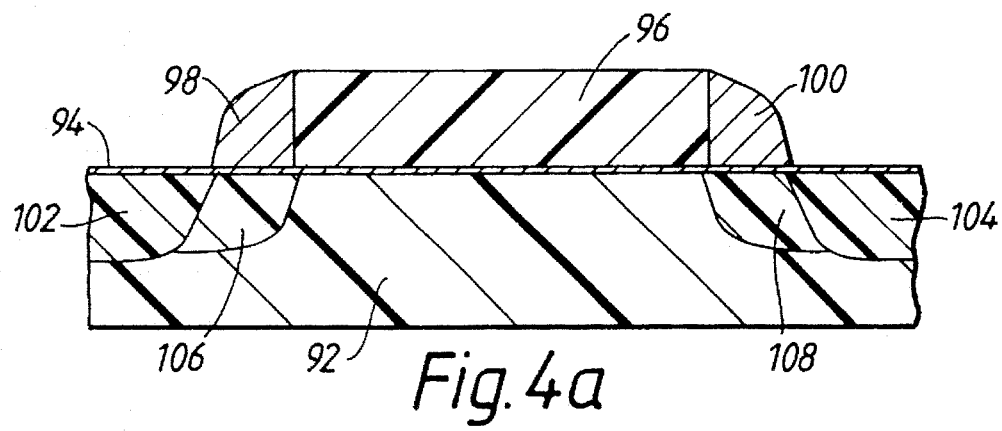
FIGS. 4a to 4d are schematic sections through a silicon wafer structure showing sequentially a series of process steps for manufacturing a semiconductor device in accordance with a fourth embodiment of the present invention.
Figure 4B:
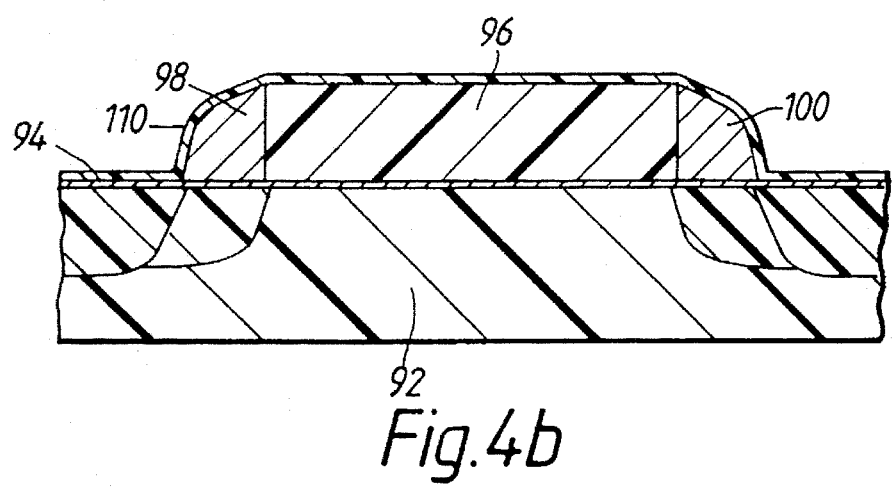

A fourth embodiment of the present invention is illustrated in FIGS. 4a to 4d. This embodiment is a modification of the third embodiment, the modification being the absence of the first silicon nitride layer which in the third embodiment is deposited over the polysilicon region and the gate oxide layer. In the fourth embodiment, the sequence of process steps up to the formation of side wall spacers and the formation of the lightly doped regions and the implanted regions adjacent the spacers is the same as that of the third embodiment except for the omission of the deposition of the silicon nitride layer. FIG. 4a shows the structure in which a gate oxide layer 94 is disposed on a silicon substrate 92 and a polysilicon region 96 is disposed on the gate oxide layer 94. Side wall spacers 98,100 have been formed on opposed sides of the polysilicon region 96. Implanted regions 102, 104 and lightly doped regions 106,108 are located in the silicon substrate 92 on respective opposed sides of the polysilicon region 96. Referring to FIG. 4b, a silicon nitride layer 110 is deposited over the polysilicon region 96, the side wall spacers 98,100 and the gate oxide layer 94.

Figure 4C:
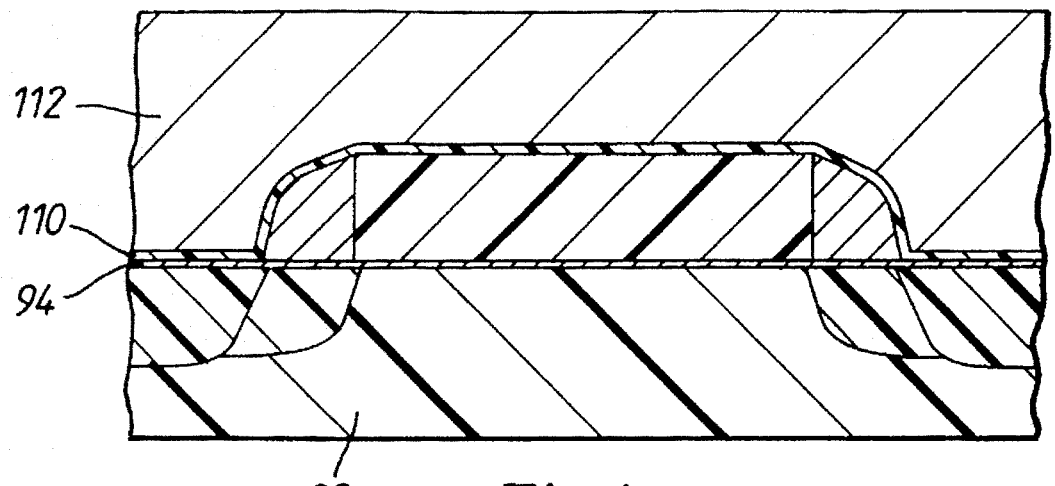
Figure 4D:
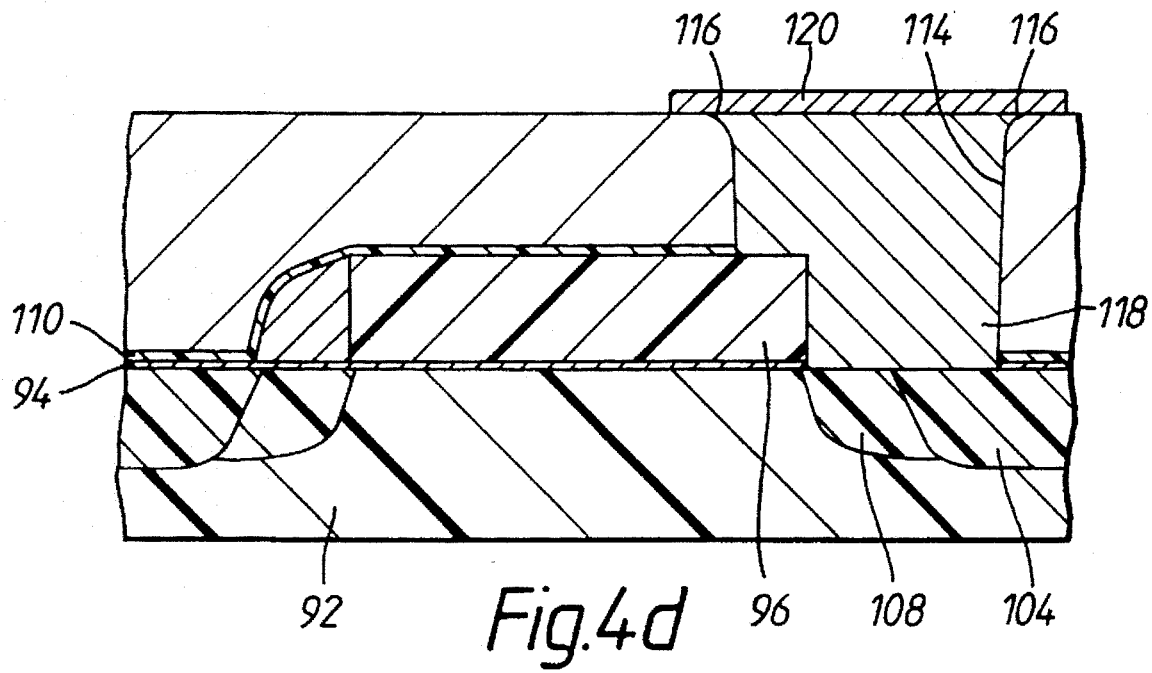

Referring to FIG. 4c a dielectric layer 112 is then deposited over the silicon nitride layer 110 and subsequently densified. As is shown in FIG. 4d, a contact hole 114 is etched through the dielectric layer 112, the silicon nitride layer 110, the side wall spacer 100 and the gate oxide layer 94 so as to expose a portion of the polysilicon region 96 and, laterally adjacent thereto, the implanted region 104 and the lightly doped region 108. The etching may be performed in the manner described above with reference to the first embodiment. The dielectric material 112 is then reflowed to form reflowed edges 116 to facilitate selective tungsten deposition in the contact hole 114. Tungsten is then selectively deposited into the contact hole 114 to form a tungsten butting contact 118 which is subsequently covered with a dummy metal layer 120 or connected to a metal layer.

The method and structure of the fourth embodiment are employed when it is not required laterally to space the lightly doped regions from the polysilicon gate.

The semiconductor device and the process of the present invention have a number of advantages over the prior art. The tungsten butting contact for connecting the polysilicon and diffused silicon regions together may be formed utilising no extra process steps if the remainder of the semi-conductor device is fabricated employing conventional CMOS process steps and if the CMOS structure incorporates tungsten plugs for electrically connecting selected silicon regions to a metal interconnect layer overlying the dielectric layer. The contact hole for the tungsten butting contact may be formed simultaneously with the contact holes for the other tungsten plugs and the tungsten can be deposited selectively in a single process step. In addition, the dummy metal pad may be deposited over the tungsten butting contact simultaneously with the formation of interconnect metal layer.

The use of tungsten permits the butting contacts to be fabricated with the minimum lateral dimension, the lateral dimension being limited only by the photolithographic capability of the process. This is because the tungsten butting contacts can be selectively deposited into substantially vertical contact holes.

Furthermore, an advantage of using a refractory metal such as tungsten over aluminium is that the resultant butting contact has reduced lateral dimensions. When tungsten is employed to form the butting contact, the device lateral dimensions can be scaled down compared to those required for aluminium which requires either or both overlap of the contact by aluminium on all sides to prevent etching of the contact during delineation of the interconnect pattern, and increased contact size at the top of the contact compared to its base in order to improve the metal step coverage. In addition, the high melting point and low silicon diffusion coefficient of tungsten and other refractory metals results in those metals being superior to aluminium in multiple level metal interconnect systems.

The present invention is not limited to the use of tungsten but can be carried out utilising any refractory metal which has low dopant diffusion therethrough and which preferably can be selectively deposited into a contact hole. Examples of such selectively depositable refractory metals are tungsten, copper, molybdenum and tantalum.

What we claim is:

1. A semiconductor device comprising a silicon substrate, an oxide layer on the silicon substrate, a doped polysilicon region disposed on the oxide layer, a dielectric layer which has been deposited over the doped polysilicon region and the silicon substrate, a contact hole which is formed in the dielectric layer and extends over respective laterally adjacent portions of the doped polysilicon region and the silicon substrate, a refractory metal contact which has been selectively deposited in the contact hole which electrically connects the said portions together, a first silicon nitride layer which covers that part of the doped polysilicon region which does not contact the contact, a side wall spacer which is disposed on the first silicon nitride layer adjacent a side of the doped polysilicon region in opposed relation to the contact and a second silicon nitride layer which covers the side wall spacer and the first silicon nitride layer.

2. A semiconductor device according to claim 1 further comprising a metal capping layer which covers an upper surface of the contact and adjacent portions of an upper surface of the dielectric layer.

3. A semiconductor device according to claim 1, wherein the side wall spacer and the contact are each located above a respective lightly doped implant region in the silicon substrate.

4. A semiconductor device according to claim 1 wherein the doped polysilicon region and the portion of the silicon substrate are doped with dopants of opposite polarity.

5. A semiconductor device according to claim 1 wherein the contact is composed of tungsten.

6. A semiconductor device comprising a silicon substrate, an oxide layer on the silicon substrate, a doped polysilicon region on the oxide layer, a dielectric layer over the doped polysilicon region and the oxide layer, a contact hole which is formed in the dielectric layer and extends over respective laterally adjacent portions of the doped polysilicon region and the silicon substrate, the doped polysilicon region and the portion of the silicon substrate being doped with dopants of opposite polarity, a tungsten contact which electrically connects the said portions together, a side wall spacer which is disposed on a first silicon nitride layer and adjacent a side of the doped polysilicon region in opposed relation to the contact, and a second silicon nitride layer which covers the side wall spacer, the first silicon nitride layer over the doped polysilicon region, and those parts of the doped polysilicon region and of the silicon substrate other than said portions.

7. A semiconductor device according to claim 6, wherein the side wall spacer and the contact are each located above a respective lightly doped implant region in the silicon substrate.

8. A semiconductor device comprising a silicon substrate, a gate oxide layer on the silicon substrate, a doped polysilicon region on the gate oxide layer, a tungsten contact extending upwardly from and electrically connecting to laterally adjacent portions of the doped polysilicon region and the silicon substrate, a side wall spacer which is disposed on a first silicon nitride layer and adjacent a side of the doped polysilicon region in opposed relation to the contact, a second silicon nitride layer which covers the side wall spacer, the doped polysilicon region, the first silicon nitride layer over the doped polysilicon region, and respective parts of the silicon substrate adjacent to the side wall spacer and the tungsten contact, and a dielectric layer covering the second silicon nitride layer, the dielectric layer and the second silicon nitride layer defining a contact hole containing the tungsten contact.

9. A semiconductor device according to claim 8, wherein the side wall spacer and the contact are each located above a respective lightly doped implant region in the silicon substrate.

10. A semiconductor device according to claim 8, wherein the doped polysilicon region and the portion of the silicon substrate are doped with dopants of opposite polarity.

\* \* \* \* \*